(12) United States Patent
Chapman et al.

(10) Patent No.: US 11,354,479 B1
(45) Date of Patent: Jun. 7, 2022

(54) POST-CTS CLOCK TREE RESTRUCTURING WITH RIPPLE MOVE

(71) Applicant: Cadence Design Systems, Inc., San Jose, CA (US)

(72) Inventors: Andrew Mark Chapman, Milton (GB); Zhuo Li, Austin, TX (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 17/315,032

(22) Filed: May 7, 2021

(51) Int. Cl.
| | |
|---|---|
| *G06F 30/396* | (2020.01) |
| *G06F 30/398* | (2020.01) |
| *G06F 30/3312* | (2020.01) |
| *G06F 30/337* | (2020.01) |
| *G06F 30/373* | (2020.01) |

(52) U.S. Cl.
CPC .......... *G06F 30/396* (2020.01); *G06F 30/398* (2020.01); *G06F 30/337* (2020.01); *G06F 30/3312* (2020.01); *G06F 30/373* (2020.01)

(58) Field of Classification Search
CPC .. G06F 30/396; G06F 30/398; G06F 30/3312; G06F 30/337; G06F 30/373
USPC ........... 716/113, 120, 108, 134, 136; 703/16
See application file for complete search history.

(56) References Cited

U.S. PATENT DOCUMENTS

| | | | | |
|---|---|---|---|---|
| 5,656,963 A | * | 8/1997 | Masleid | H03K 19/00323 257/786 |
| 6,080,206 A | * | 6/2000 | Tadokoro | G06F 30/394 716/124 |
| 6,711,716 B1 | * | 3/2004 | Mueller | G06F 1/10 326/38 |
| 7,418,675 B2 | * | 8/2008 | MacDonald | G06F 30/30 716/133 |
| 2003/0156652 A1 | * | 8/2003 | Wise | G06F 13/16 711/E12.003 |
| 2009/0217225 A1 | * | 8/2009 | Sunder | G06F 1/10 716/113 |
| 2012/0240091 A1 | * | 9/2012 | Sunder | G06F 30/3312 716/113 |
| 2014/0047402 A1 | * | 2/2014 | Terayama | G06F 30/392 716/108 |
| 2019/0235568 A1 | * | 8/2019 | Ou | H03K 19/017509 |

* cited by examiner

*Primary Examiner* — Phallaka Kik
(74) *Attorney, Agent, or Firm* — Schwegman Lundberg & Woessner, P.A.

(57) ABSTRACT

A system for performing operations including accessing an integrated circuit design that includes a clock tree interconnecting a clock source to a plurality of clock sinks. The operations include receiving a request to adjust a current timing offset of the clock tree to a target timing offset. The clock tree is modified by moving a terminal of the group from a first location in the clock tree to a second location in the clock tree to generate an updated clock tree. During modification, the first and second locations are analyzed to determine a load reduction and increase at the respective terminals. One or more neighboring clock tree instances are adjusted to compensate for the load reduction and increase. The operations include providing an indication that the clock tree has been updated and complies with the target timing offset.

20 Claims, 12 Drawing Sheets

POST-CTS CLOCK TREE RESTRUCTURING WITH RIPPLE MOVE

TECHNICAL FIELD

The present disclosure generally relates to the technical field of integrated circuit design. In particular, the present disclosure addresses systems and methods for performing post-dock tree synthesis (CTS) restructuring.

BACKGROUND

An integrated circuit (IC) layout specifies portions of various components of an IC. When the IC is to include a large number of registers, latches, flip-flops and/or other types of clocked devices ("sinks") that are to be clocked by one or more clocks, the IC must include one or more clock trees for delivering the clock signal from the clock source to all of the sinks to be clocked by it. A clock tree distributes a clock signal from its root to a set of sinks within an IC through a branching network of drivers (e.g., buffers or inverters). A single driver distributes the clock signal to a grouping of other drivers and/or sinks. Connectivity between a driver and its fanout is represented by a "clock net" and will be physically implemented by routed wires.

BRIEF DESCRIPTION OF THE SEVERAL VIEWS OF THE DRAWINGS

Various ones of the appended drawings merely illustrate example embodiments of the present inventive subject matter and cannot be considered as limiting its scope.

DETAILED DESCRIPTION

Figure 1:
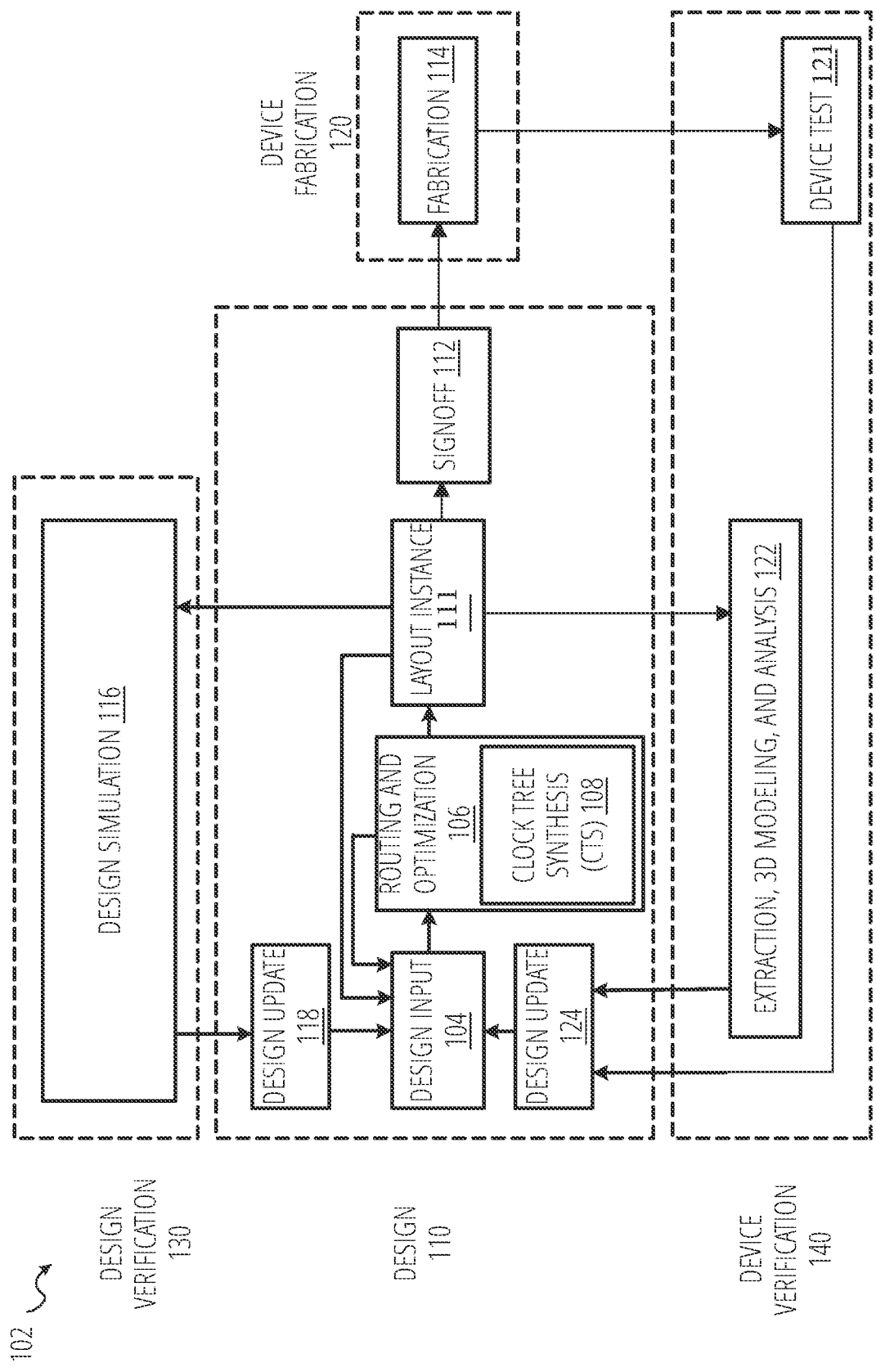
FIG. 1 is a diagram illustrating an example design process flow that includes post-CTS clock-tree restructuring in accordance with some embodiments.

Reference will now be made in detail to specific example embodiments for carrying out the inventive subject matter. Examples of these specific embodiments are illustrated in the accompanying drawings, and specific details are set forth in the following description in order to provide a thorough understanding of the subject matter. It will be understood that these examples are not intended to limit the scope of the claims to the illustrated embodiments. On the contrary, they are intended to cover such alternatives, modifications, and equivalents as may be included within the scope of the disclosure.

Electronic design automation (EDA) software systems commonly perform clock-tree synthesis (CTS). Conventional approaches to CTS typically include a labor-intensive process that generates a mapping of clock signals to each sequential elements within a design. Generally, buffers and inverters are inserted along a clock path to achieve minimum skew. For ICs, a clock may consume approximately half of the total power consumption and, as such, processes that reduce power consumption for optimized clock trees help reduce the total power cost. However, conventional CTS do not provide opportunities to adjust the delay placements within a clock tree after CTS has completed.

Traditional techniques for clock tree restructuring include performing delay reduction requests before or during CTS, not after CTS has completed. Aspects of the present disclosure address this problem, among others, with systems and methods for post-CTS clock tree restructuring that include adjusting clock sinks to attain a timing target with a reduction in delay. By exercising the solutions described herein, delay time reduction is achieved without needing to perform a time and resource intensive generation of a new clock tree via CTS. However, conventional CTS do not provide opportunities to adjust the delay placements within the clock tree after CTS has completed.

As such, systems and methods for adjusting skew times after CTS has completed is a desired. Adding delays after CTS has completed may include solutions such as inserting delaying buffers above individual sinks or groups of sinks. However, reducing delay times is much more complicated.

Small delay reductions can be implemented through changing the sizing of buffers, but it is difficult to and impractical to target individual sinks. Large delay reductions can involve fewer stages of buffering elements between the clock source and the clock sinks. Both large and targeted delay reductions are difficult to perform after CTS (e.g., post CTS) as both require a different clock tree structure. As the CTS generates a clock network in a holistic manner; any restructuring after the generation of the clock tree can impact other components of the clock tree.

Conventional approaches to reducing skew (reducing delay) within clock trees include addressing such request prior to or during CTS. The delay of clock sinks (e.g., flipflop, latch) are measured as the time for a clock signal to travel from the clock root (e.g., source) to that particular sink. After CTS, adding additional requests for reduction in delays or targeted changes is unavailable.

The methods and systems described herein provide the ability to significantly reduce the delay to select clock sinks even after CTS. The reduction in delay can be generated through a user interface (e.g., graphical user interface (GUI)) or automatically generated. A system disclosed and described herein includes memory storing instructions that, when executed by the one or more processors, cause the system to perform operations. The operations include accessing an integrated circuit design stored in the memory. The integrated circuit design includes a clock tree that includes routes that interconnect a clock source to a plurality of clock sinks. The operations include receiving a request to adjust a current timing offset of the clock tree to a target timing offset. Based on the received request, the system identifies a group of clock sinks from the clock tree to be adjusted to satisfy the request. The operations further include restructuring the clock tree by moving a terminal of the group from a first location in the clock tree to a second location in the clock tree to generate an updated clock tree. The operations further include providing an indication that the updated clock tree has been generated and complies with the target timing offset. The received request may result in a delay adjustment for one or more clock sinks. The adjustment may increase, decrease, or maintain the clock skew.

In accordance with some embodiments, moving the terminal of the group from the first location in the clock tree to a second location in the clock tree advances the group of clock sinks to the second location in the clock tree. The second location in the clock tree is at a location closer to the clock source than the first location and provides a reduction in the delay of the clock sink. Additionally, and/or alternatively, the operation of moving the terminal to the second location in the clock tree may result in a reduction in clock skew. The clock skew is the measured difference in delay between the shortest delay and the longest delay over all of the clock sinks within the clock tree. To obtain the clock skew, the delay of the clock sink with the shortest delay is subtracted from the delay of the clock sink with the longest delay.

In accordance with some embodiments, clock sinks are grouped together with respect to either physical proximity within the clock tree, logical and/or electrical equivalence, and/or a similar targeted delay offset. As part of this process, the pin for connectivity change (clock tree rearrangement or modification) is identified. In some embodiments, the pin is the clock sink pin or an input pin of a buffer/inverter that drives the selected group of clock sinks. In some embodiments, the pin is an input pin of a new instance created from cloning an existing instance. After identifying the pin, a new location or reassignment location is identified. For requests for delay reductions in the clock tree, the clock sinks will be relocated to a higher node in the clock tree, closer to the clock signal than where the group of clock sinks had been assigned based on the generation during CTS. After identifying the new location, any compensation for electrical changes resulting from the reassignment is calculated to determine if the relocation is a viable solution. As part of the determination, the first location (starting location of the clock sinks) is analyzed to determine a load reduction that will be felt at the first location caused by moving the clock sinks to a second location. Additionally, the second location (receiving node of the clock sinks) are analyzed to determine a load increase caused by relocation of the clock sinks from their previous location (e.g., first location) to the new location (e.g., second location). One or more neighboring instances of the group of clock sinks are also adjusted to compensate for the load reduction at the first location and the load increase at the second location. If the modifications are viable (e.g., the clock tree remains within design constraints), the modification is processed, and an indication is provided that the clock tree has been modified and complies with the target timing offset.

The various operations of example methods described herein may be performed, at least partially, by one or more processors that are temporarily configured (e.g., by software) or permanently configured to perform the relevant operations. Similarly, the methods described herein may be at least partially processor-implemented. For example, at least some of the operations of a method may be performed by one or more processors. Moreover, the one or more processors may also operate to support performance of the relevant operations in a "cloud computing" environment or as a "software as a service" (SaaS). For example, at least some of the operations may be performed by a group of computers (as examples of machines including processors), with these operations being accessible via a network (e.g., the Internet) and via one or more appropriate interfaces (e.g., an API). The performance of certain of the operations may be distributed among the one or more processors, not only residing within a single machine, but deployed across a number of machines. In some example embodiments, the processor or processors may be located in a single location (e.g., within a home environment, an office environment, or a server farm), while in other embodiments the processors may be distributed across a number of locations.

FIG. 1 is a diagram illustrating an example design process flow that includes post-CTS clock-tree restructuring in accordance with some embodiments. The term "restructuring" and "modifying" are used interchangeable herein and is understood to mean an update is being made to the clock tree as described. As shown, the design process flow 102 includes a design phase 110, a device fabrication phase 120, a design verification phase 130, and a device verification phase 140. The design phase 110 involves an initial design input 104 operation where the basic elements and functionality of a device are determined, as well as revisions based on various analyses and optimization of a circuit design. This design input 104 operation is where block instances are used in the circuit design and any additional circuitry for the design around the blocks is selected. The initial strategy, tactics, and context for the device to be created are also generated in the design input 104 operation, depending on the particular design algorithm to be used.

In some embodiments, following an initial selection of design values in the design input 104 operation, routing, timing analysis, and optimization are performed in a routing and optimization 106 operation, along with any other automated design processes. While the design process flow 102 shows optimization 106 occurring prior to a layout instance 111, routing, timing analysis, and optimization 106 may be performed at any time to verify operation of a circuit design. For instance, in various embodiments, timing analysis in a circuit design may be performed prior to routing of connections in the circuit design, after routing, during register transfer level (RTL) operations, or as part of a signoff 112.

As shown, the routing and optimization 106 operation includes a clock tree synthesis (CTS) 108 operation, which may be performed in accordance with various embodiments described herein. The CTS 108 operation can generate a clock tree that delivers a clock signal from a clock tree root, which comprises a clock source of a circuit design, to a plurality of clock tree leaf nodes, which comprises a plurality of clock tree sinks within the circuit design. According to various embodiments, the clock tree restructuring is performed as a part of the CTS 108 operation that includes placing clock drivers at various regions of the IC design based on satisfaction of a set of clock tree design constraints, which can include slew, latency, and power consumption by the generated clock tree. Each clock tree driver delivers the clock signal to a set of clock sinks and/or a set of clock drivers. A clock net of the IC design describes interconnections between a clock driver and the clock sinks and drivers that are driven by the clock driver. Any one of the clock sources, sinks, and drivers may be referred to herein as a "clock instance."

An initial clock tree is constructed, for example, using the Steiner-tree approach. With the Steiner-tree approach, a minimum rectilinear Steiner tree (MRST) is used for routing a multi-pin clock net with minimum wire length. Given in points in the plane, an MRST connects all points by rectilinear lines, possibly via some extra points (called Steiner points), to achieve a minimum-wire-length tree of rectilinear edges. It shall be appreciated that the Steiner-tree approach is merely an example of the approach used to construct the initial clock tree, and in other embodiments, the computing device may utilize one of several known clock tree construction techniques to construct the initial clock tree.

As will be discussed further below, the initial clock tree may be iteratively refined as part of a clock tree restructuring process. As part of this process, a new potential location for each clock sink or group of clock sinks are determined and validated to verify it results in a timing delay reduction and conforms to timing-based design constraints. At each iteration, terminals of a clock instance (e.g., routed pins) are identified and an offset for each terminal is determined based on a distance between the terminal and a core route in the clock tree.

A target offset for moving the clock tree instance is determined based on a combination of terminal offsets, and the clock tree instance is moved toward the clock source. In this manner, the clock tree instance is moved from an initial location to a target location based on various factors that allow the timing delay to be improved. The clock tree is updated based on the new location of the clock instance by modifying the connected routes based on the new location (e.g., by shortening one or more routes).

Assuming a successful validation of the updated clock tree, the clock tree restructuring process may proceed to adjust a next clock tree instance in the clock tree, and a new location for the next clock tree instance is determined and validated in the same manner as described above. In some embodiments, the clock tree restructuring process may proceed to adjust a next clock tree instance upon rejection of a first update. For example, if an optimization at a first location is rejected as being without a viable or beneficial adjustment, an optimization at a second location can be performed. In other words, later optimizations do not necessarily rely on a successful previous optimization. The process may be repeated until a new location has been tested for every clock tree instance in the clock tree.

Consistent with some embodiments, the clock tree restructuring process described above may be repeated in multiple passes such that the process is performed for each potential location for relocation of a clock sink or a group of clock sinks in a first pass, and the processes is subsequently performed to verify the adjusted relocation will or will not implicate various other portions of the design.

After design inputs are used in the design input 104 operation to generate a circuit layout, and any of the routing and optimization 106 operations are performed, a layout is generated in the layout instance 111. The layout describes the physical layout dimensions of the device that match the design inputs. Prior to this layout being provided to a fabrication 114 operation, the signoff 112 is performed on the circuit design defined by the layout.

After signoff verification by the signoff 112, a verified version of the layout is used in the fabrication 114 operation to generate a device, or additional testing and design updates may be performed using designer inputs or automated updates based on design simulation 116 operations or extraction, 3D modeling, and analysis 122 operations. Once the device is generated, the device can be tested as part of device test 121 operations, and layout modifications generated based on actual device performance.

A design update 118 from the design simulation 116; a design update 118 from the device test 121 or the extraction, 3D modeling, and analysis 122 operations; or the design input 104 operation may occur after the initial layout instance 111 is generated. In various embodiments, whenever design inputs are used to update or change an aspect of a circuit design, a timing analysis and the routing and optimization 106 operation may be performed.

Figure 2:
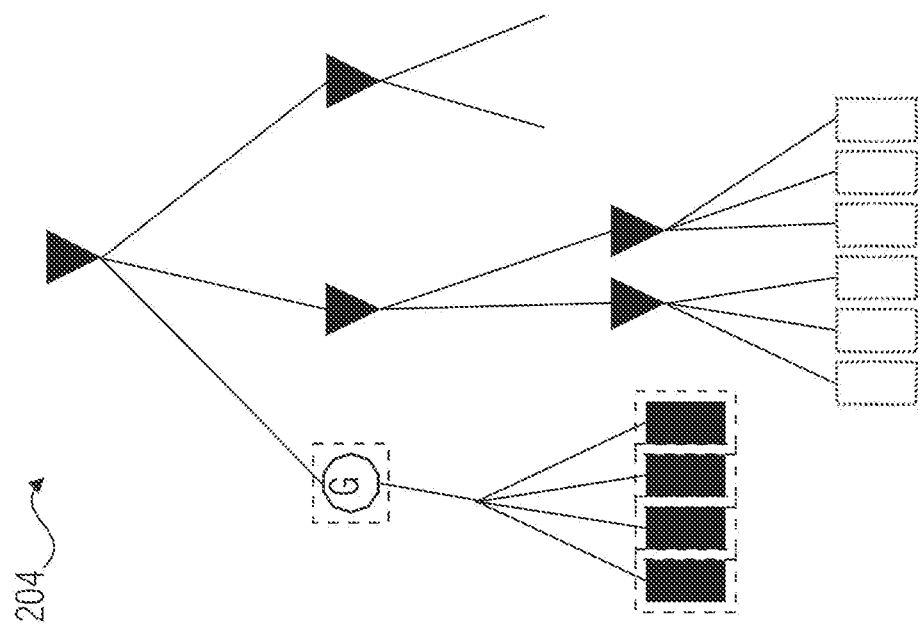
FIGS. 2-9 are diagrams illustrating examples of clock trees and updated clock trees based on restructuring in accordance with some embodiments.
Figure 2:
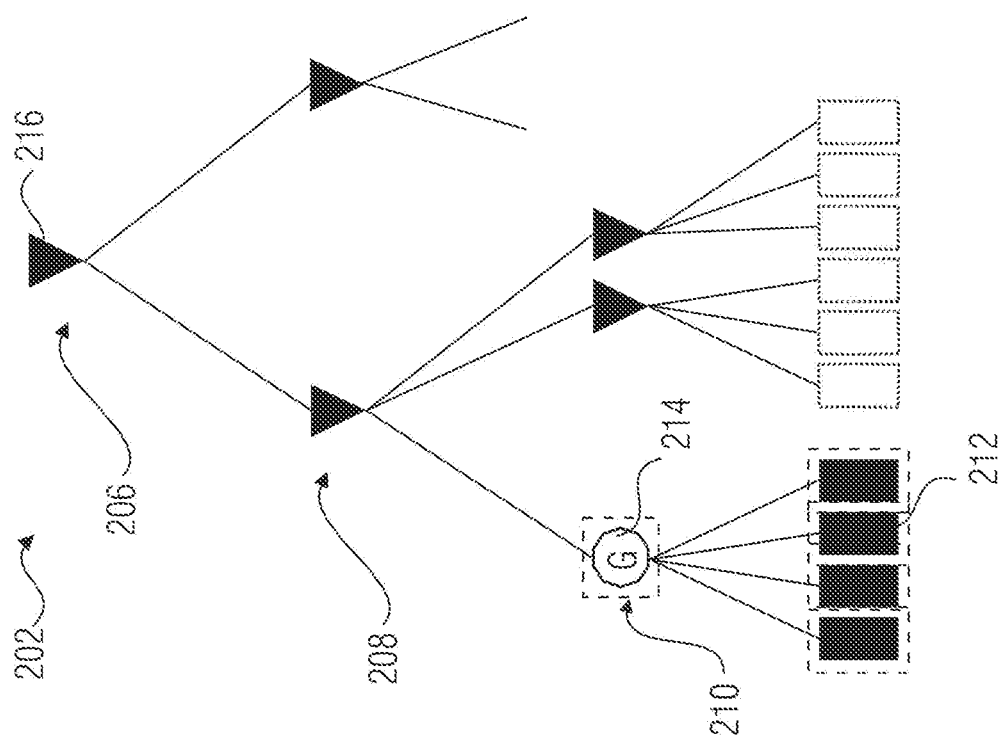

FIG. 2 is a diagram illustrating an example of clock trees and updated clock trees based on restructuring in accordance with some embodiments. As used and described herein, a terminal may be described or referred to as a node. It is understood that a terminal and a node may be used interchangeably throughout this disclosure. Additionally, it is understood that the clock tree diagrams illustrated herein may not show the entirety of the clock tree for the IC and is an example of a portion of the clock tree for ease of reference and discussion.

A first clock tree segment 202 includes several clock tree instances at various levels (e.g., first level 206, second level 208, third level 210) within the clock tree. The clock tree operates from the top down, meaning the timing delays increase at each level beneath the origination node 216 at the top of the clock tree. The origination node 216 is referred to herein as the clock source. It is understood that the origination node (e.g., clock source) can be found multiple levels above origination node 216 shown in the FIGS. The FIGS. 2-7 may display a portion or a segment of the clock tree and may not necessarily be a representation of the entire clock tree. Thus, in some embodiments, the clock source can be found several levels above the location of node 216. In response to a request to reduce a timing delay, a group of clock tree instances (e.g., group 212) is identified for relocation from a third level 210 to a level higher than the third level 210. Group 212 is selected to be adjusted to the second level 208. In the example shown in FIG. 2, the terminal connecting the group of clock sinks is a clock gate 214. The entire group of clock sinks including the clock gate is selected to be reassigned to a higher node (e.g., node 214 of first level 206).

The second clock tree segment 204 illustrates the resulting portion of the clock tree after the restructuring has occurred. Group 212 has been pulled up to a higher level by the input terminal (e.g., clock gate 214). Various other configurations for adjusting timing delays are contemplated and described with respect to other example figures herein such as FIGS. 3-7.

Figure 3:
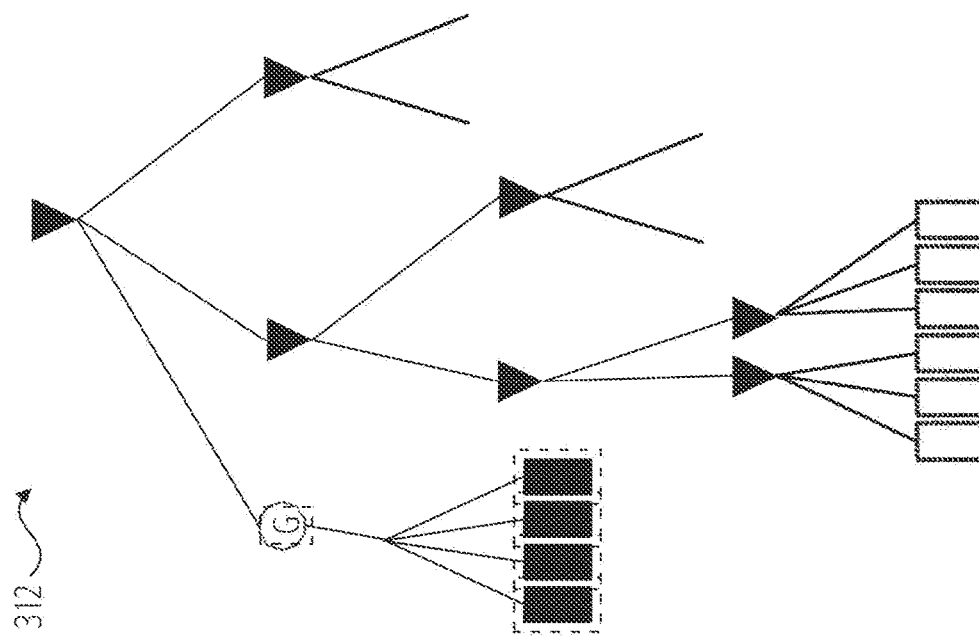
Figure 3:
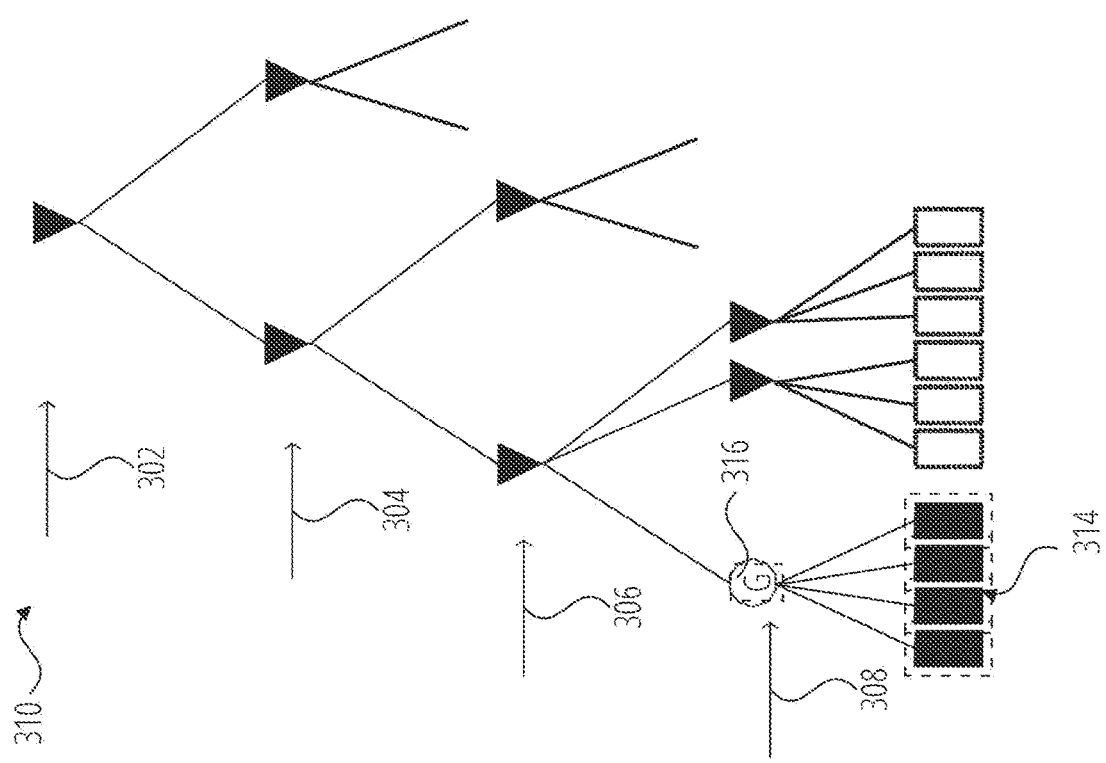

FIG. 3 is a diagram illustrating a second example of clock trees and updated clock trees based on restructuring in accordance with some embodiments. A third clock tree segment 310 includes several clock tree instances at various levels similar to the ones shown in FIG. 2, FIG. 3 includes levels 302, 304, 306, and 308. In some embodiments, a reduction in timing delay necessitates an identified clock group to be moved up toward the clock source by multiple levels to meet the timing requirements. As shown, group 314 is identified as the group of clock sinks to be relocated within the clock tree from level 308 (e.g., the bottom-most level).

The fourth clock tree segment 312 illustrates the resulting portion of the clock tree after the restructuring has occurred. Group 314 has been pulled up to a higher node by two levels (e.g., from 308 to 304). Similar to FIG. 2, group 314 has been pulled up to level 304 by the input terminal (e.g., clock gate 316).

Figure 4:
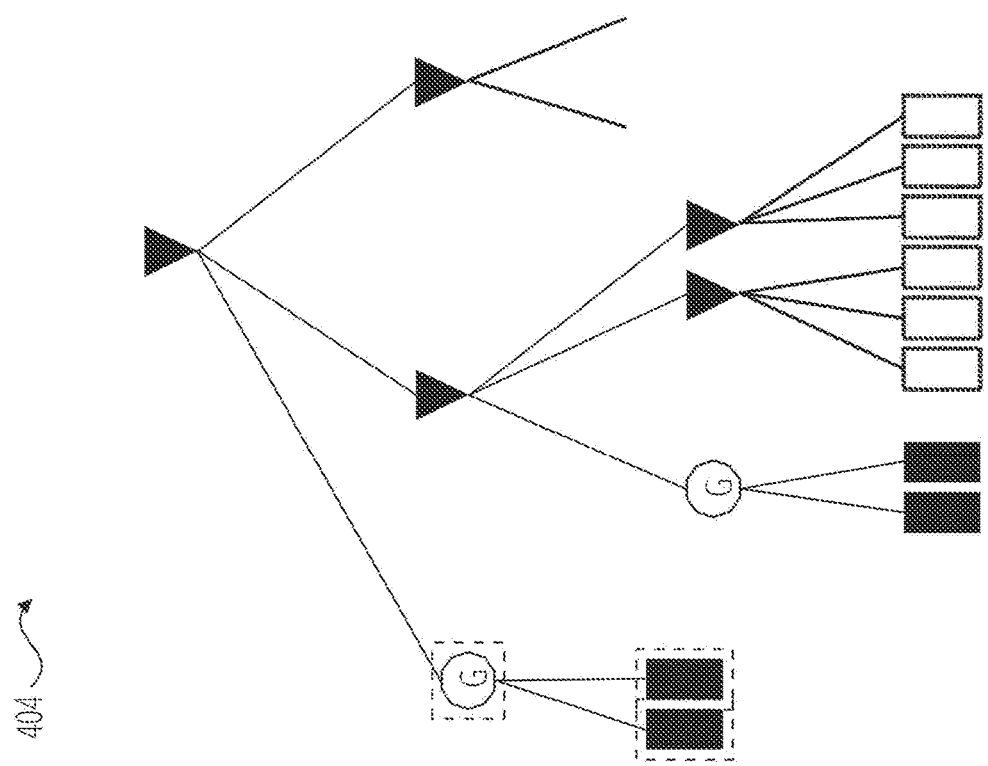
Figure 4:
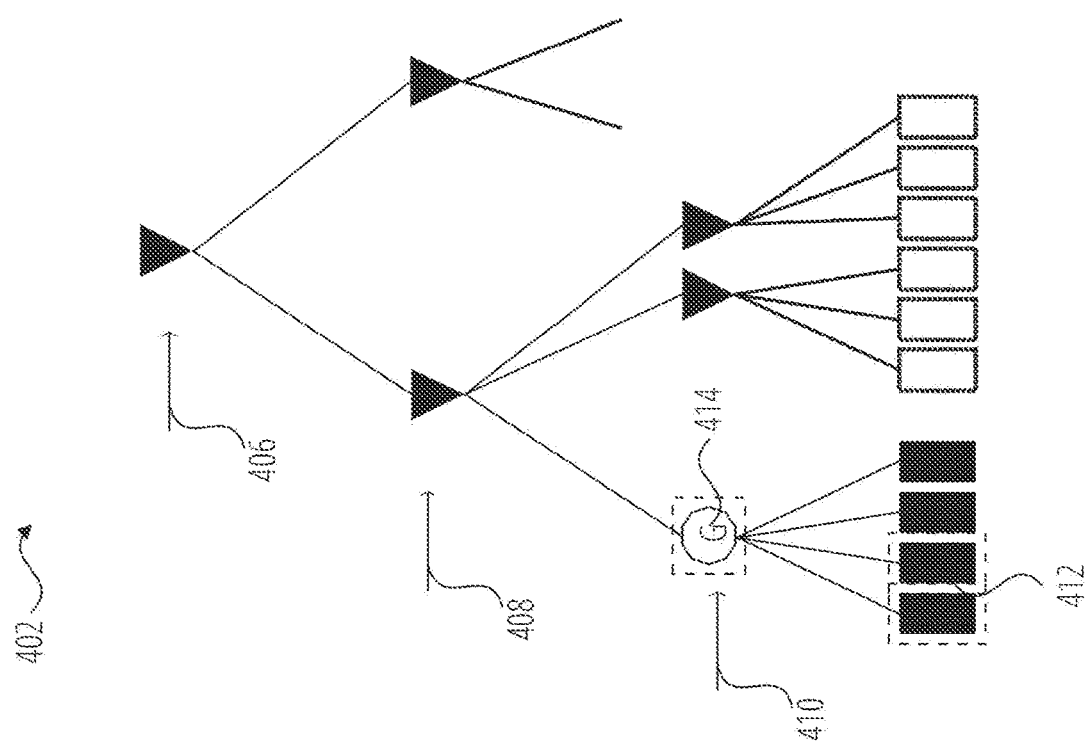

FIG. 4 is a diagram illustrating a third example of clock trees and updated clock trees based on restructuring in accordance with some embodiments. A fifth clock tree segment 402 includes several clock tree instances at various levels (e.g., level 406, 408, 410). In some embodiments, the terminal 414 (input) of a group is cloned and a sub-group of clock sinks 412 is selected and relocated to a higher node along with the cloned input. As shown, group 412 of the fifth clock tree segment 402 includes an input clock gate. The clock gate is cloned and a sub-group is selected for relocation. The remaining portion of the group of clock sinks remains at its original location. As shown in the sixth clock tree segment 404, sub-group 412 of the fifth clock tree was relocated to a higher level level 408) along with the cloned clock gate 414. The rest of the clock tree instances of the group remain at level 410.

Figure 5:
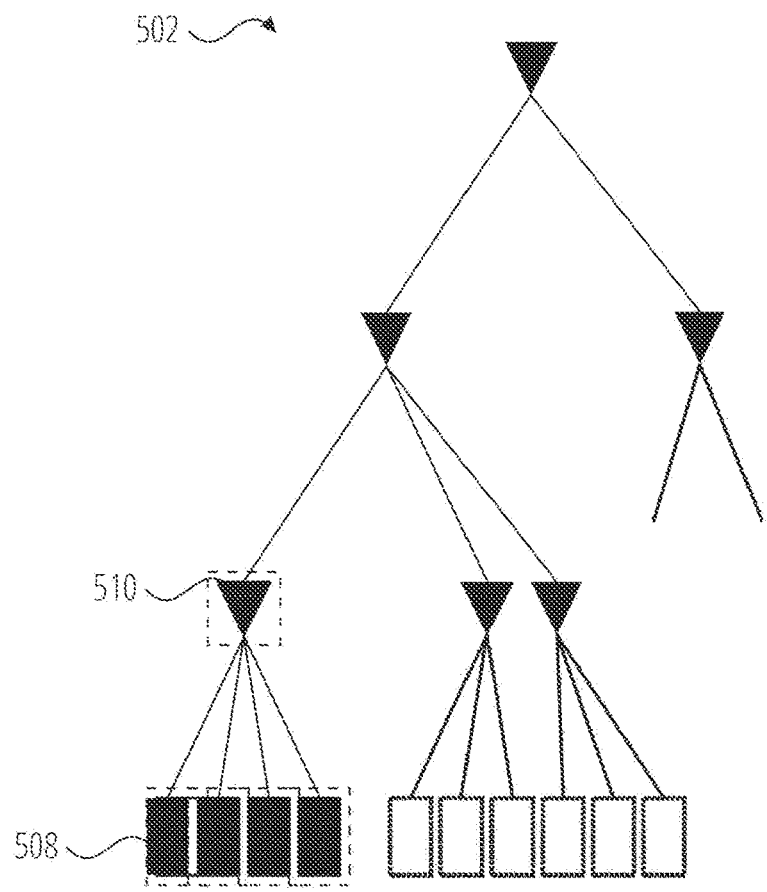
Figure 5:
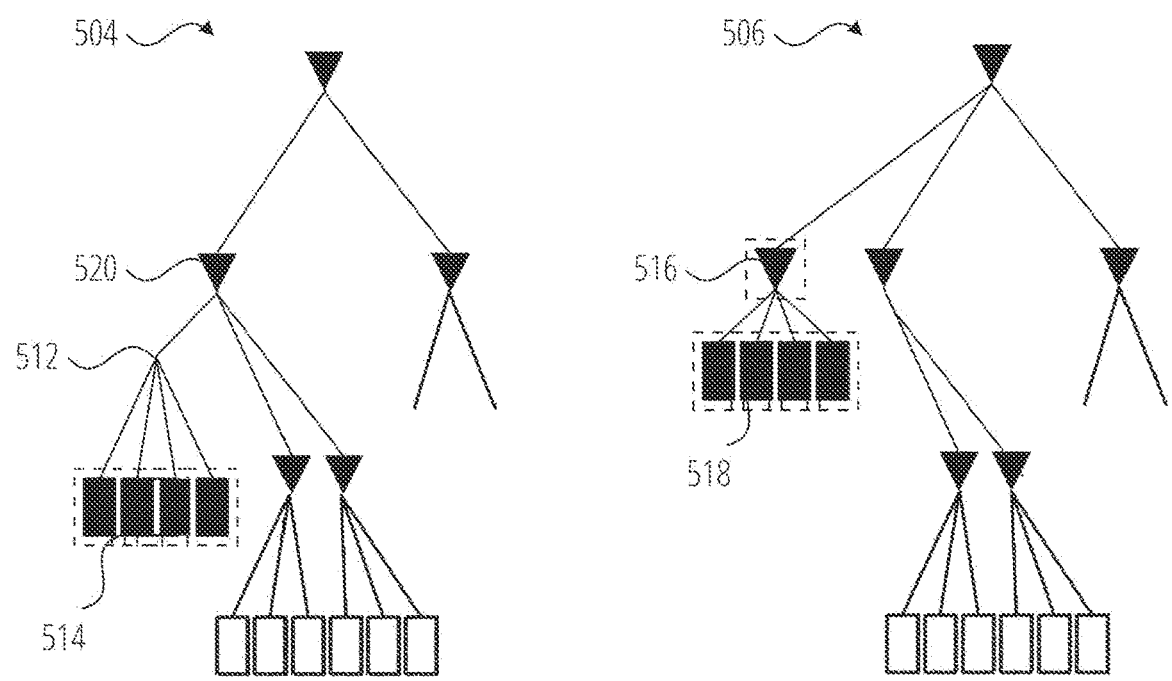

FIG. 5 is a diagram illustrating a fourth example of clock trees and updated clock trees based on restructuring in accordance with some embodiments. An example of a clock tree diagram 502 identifies a group of clock tree instances to be restructured. In some embodiments, the methods and systems described herein provide multiple options for relocating the group that complies with the requested timing adjustment. A first option is described with reference to clock tree diagram 504 and a second option is described with reference to clock tree diagram 506.

Clock tree diagram 504 is an example of a restructured clock tree diagram where group 514 is essentially pulled up to a higher level by removing clock tree instance 510 and thus group 514 depends from a clock tree instance 520. In this option, the leaf driver (e.g., clock tree instance 510) is deleted.

In another solution, clock tree diagram 506 relocates the group 508 including clock tree instance 510 to a higher node. In this option, the leaf driver (e.g., clock tree instance 510) is reparented, or reattached at a higher node. Although groups 508, 514, and 518 are numbered accordingly, it is understood that the groups themselves remain intact but the positioning within the clock tree may change.

Either of the options shown with regards to an example clock tree diagram 504 or 506 can be implemented. Further selection or implementation of various variables may indicate a preference for restructuring the clock tree using the methods of one option over the other.

Figure 6:
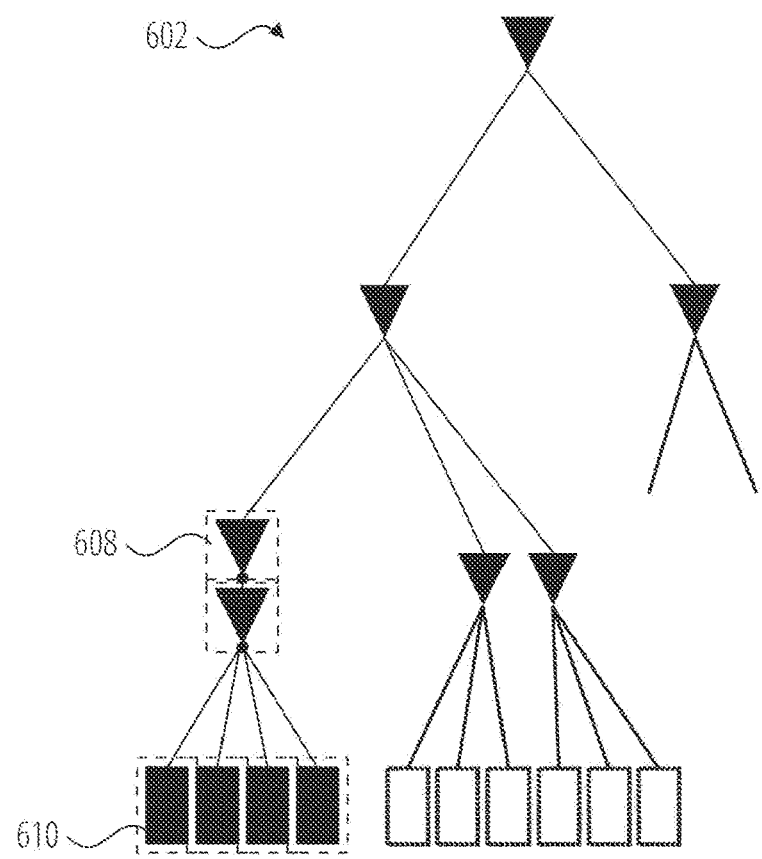
Figure 6:
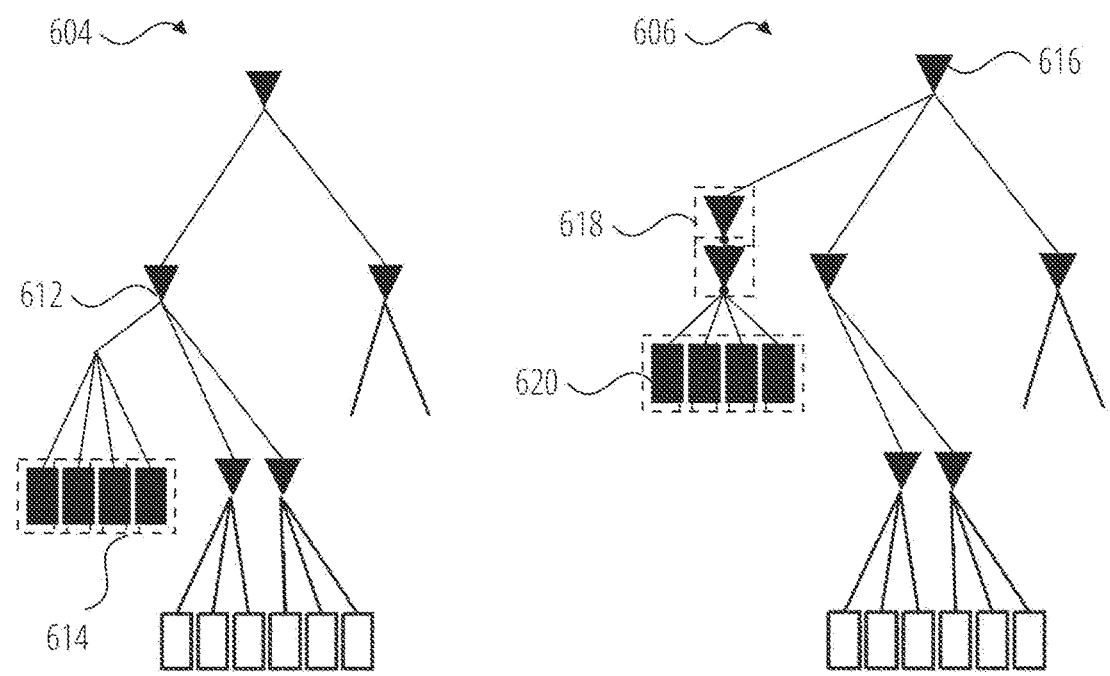

FIG. 6 is a diagram illustrating a fifth example of clock trees and updated clock trees based on restructuring in accordance with some embodiments. An example of a clock tree diagram 602 includes an identified group of clock tree instances 610 to be restructured. In some embodiments, there are multiple options for relocating the identified group. A first option is described with reference to clock tree diagram 604 and a second option is described with reference to clock tree diagram 606.

The clock tree diagram 602 includes a pair of inverters 608 and group of clock tree instances 610. There are several options to restructure clock tree diagram 602 including deleting the inverter pair 608 or reparenting the top inverter.

The first option is described with reference to clock tree diagram 604. The pair of inverters 608 are deleted and the group of clock tree instances 610 become dependent from a higher node (e.g., node 612).

The second option is described with reference to clock tree diagram 606. The pair of inverters 608 and the group of clock tree instances are altogether restructured to depend from a higher node (e.g., node 616).

Although groups 610, 614, and 620 are numbered accordingly, it is understood that the groups themselves remain intact but the positioning within the clock tree may change. Either of the options shown with regards to example clock tree diagrams 604 or 606 can be implemented. Further selection or implementation of various variables may indicate a preference for restructuring the clock tree using the methods of one option over the other.

Figure 7:
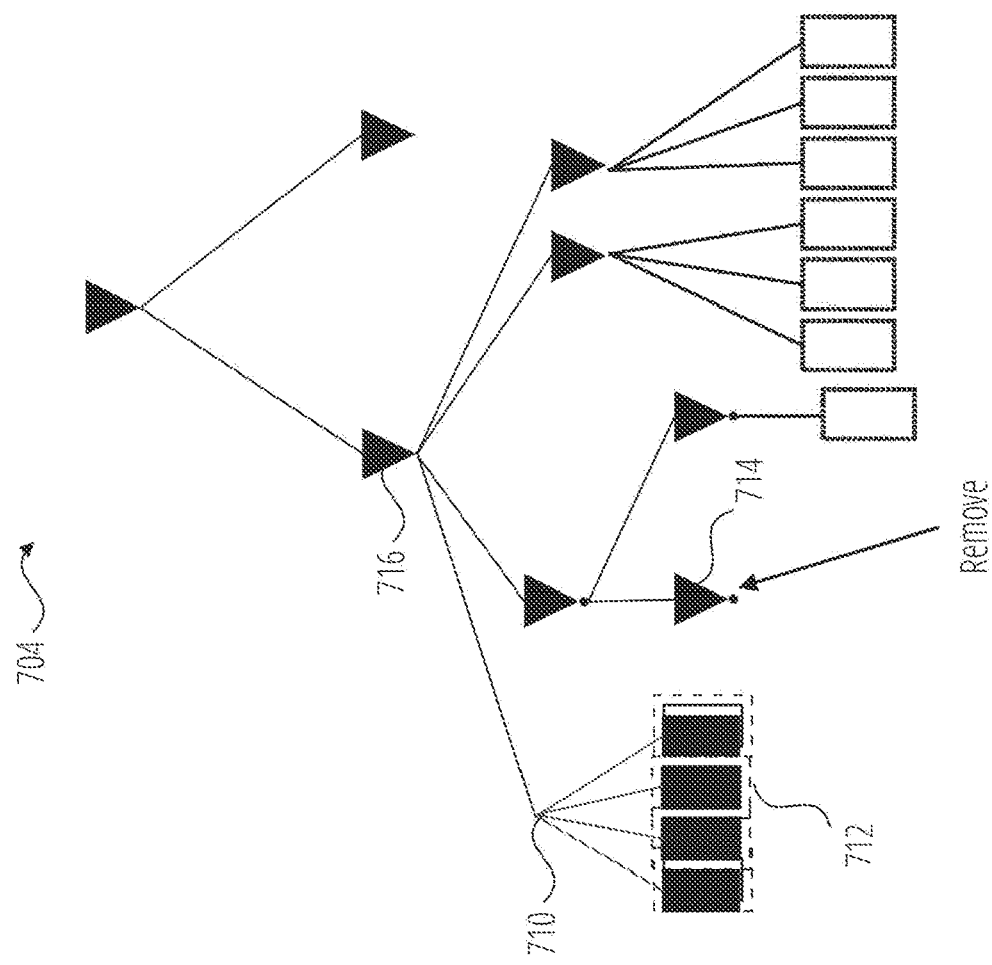
Figure 7:
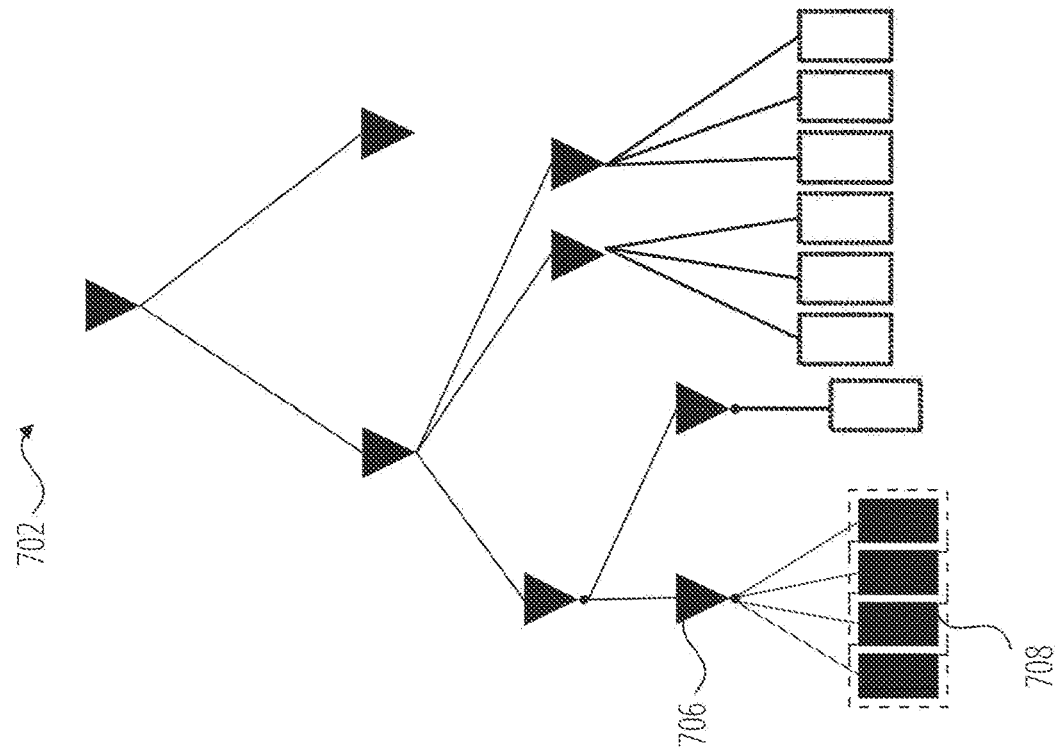

FIG. 7 is a diagram illustrating a sixth example of clock trees and updated clock trees based on restructuring in accordance with some embodiments. An example clock tree diagram 702 includes an identified group of clock tree instances 708 to be restructured. The group of clock tree instances 708 is restructured to depend from a higher node (e.g., node 716 of clock tree diagram 704). After the group of clock tree instances 708 has been relocated from node 706 to node 716, node 706 (e.g., node 714 of clock tree diagram 704) is not connected to anything. In such a case, the "dangling" node is deleted.

Figure 8:
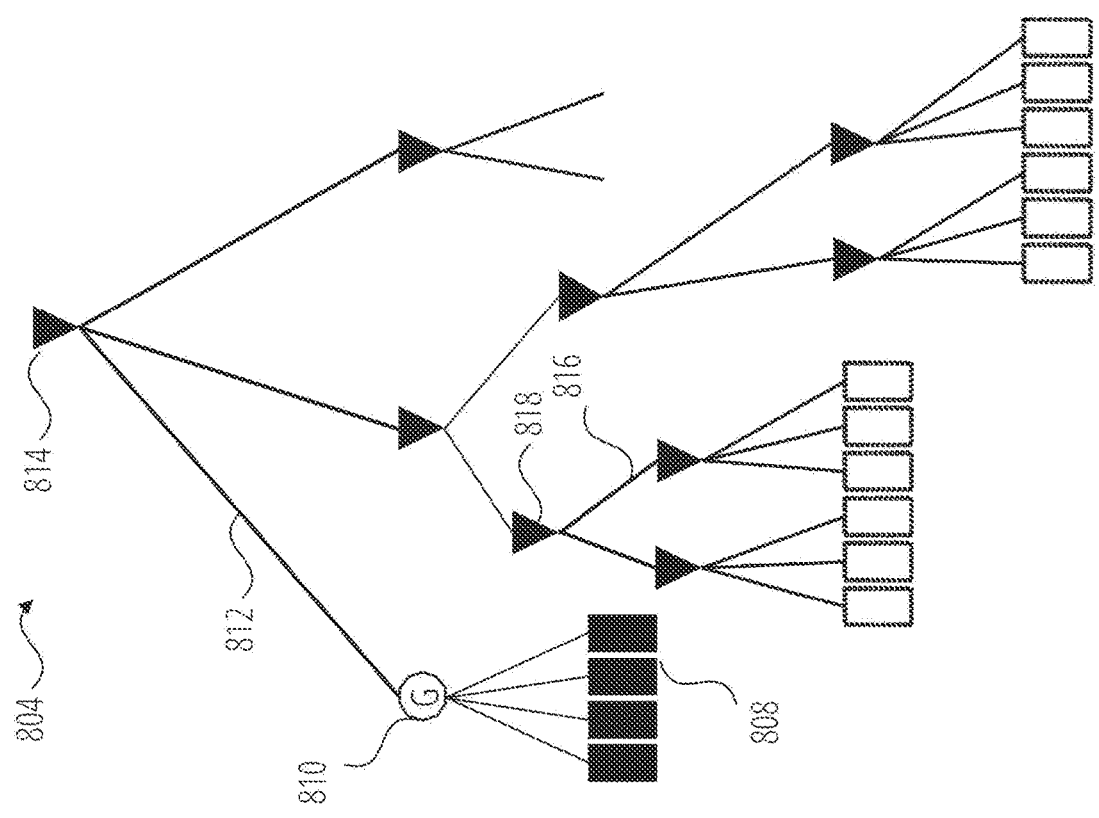
Figure 8:
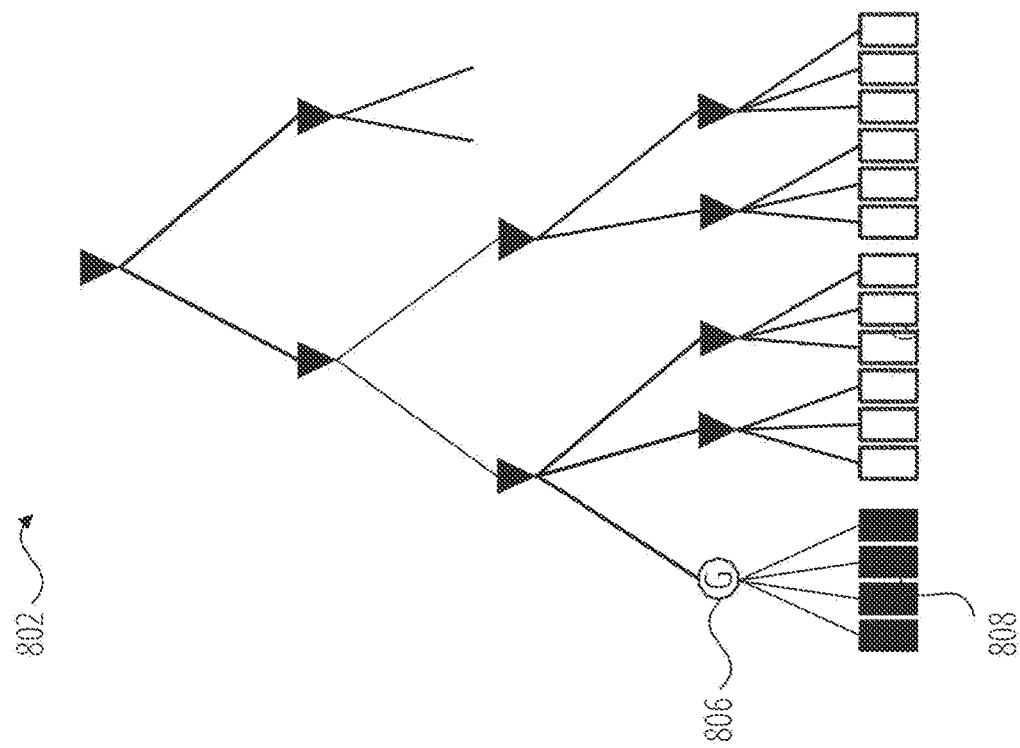

FIG. 8 is a diagram illustrating a seventh example of a portion of a clock tree and an updated portion of the clock tree for targeted restructuring post-CTS in accordance with some embodiments. An example clock tree diagram 802 includes an identified group of clock tree instances 808 to be restructured. The group of clock tree instances 808 is restructured to depend from a higher node (e.g., node 814 of clock tree diagram 804). However, relocating the group of clock tree instances from node 806 to node 814 faces difficulties. A first error is detected as wirelength 812 becomes too long (e.g., the load is too high) to be supported by node 814. A second error is detected as wirelength 816 becomes too short (e.g., the load is too low) as the node 818 previously supported three groups of clock sinks and now only supports two. To address these errors, neighboring instances are reviewed to determine which nodes (if any) have spare capacities for rebalancing the loads within the clock tree. The restructuring considers both the changes to the load due to the number of input pins being driven as well as the length of the wire.

For example, a node (e.g., node 814) has an increased load. The load is increased on the node due to the node now driving three nodes as opposed to the original two nodes. There is an additional capacitive load from each input pin that the node must now drive. The load is also increased because of the increased wirelength. The length of the wire corresponds to the capacitive load of the node. Similarly, a node (e.g., node 818) has a decreased load because of fewer input pins and a shorter wirelength.

Figure 9:
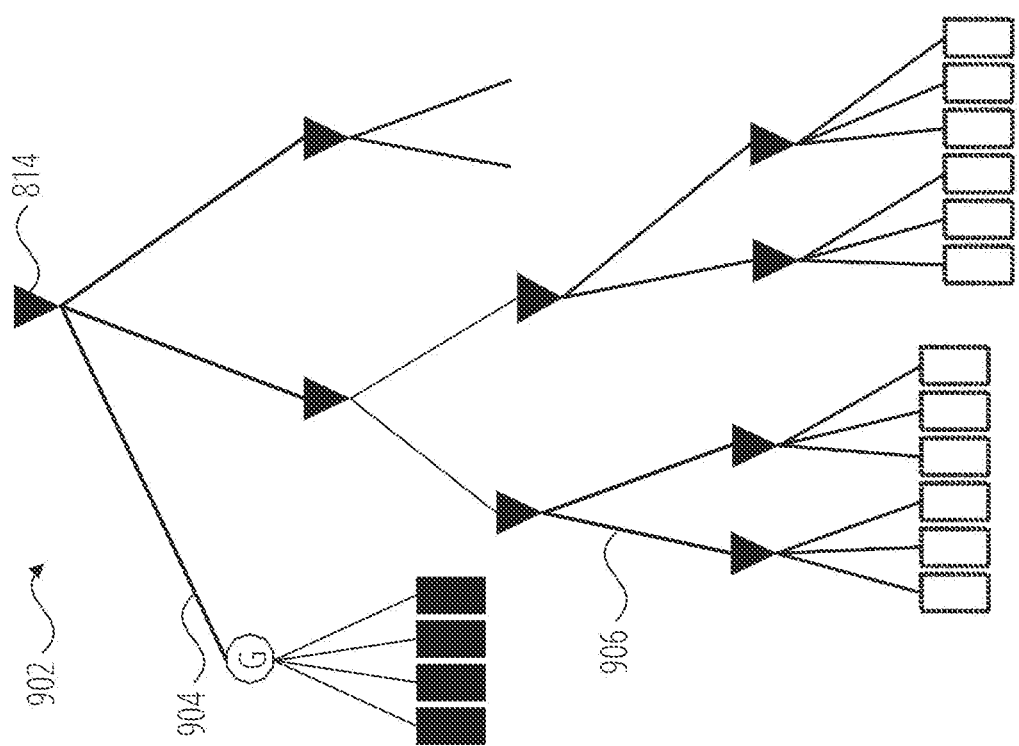
Figure 9:
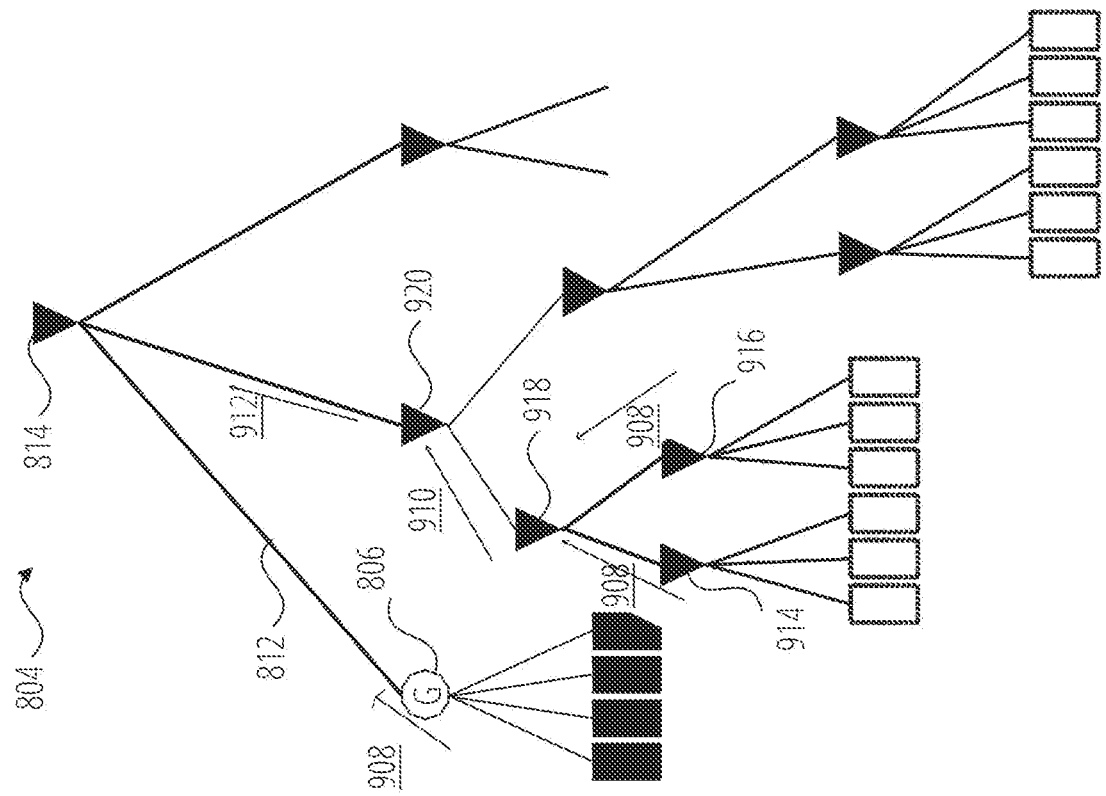

FIG. 9 is a reproduction of example clock tree diagram 804 discussed in accordance with some embodiments, To rebalance the clock tree diagram 804, node 806 is shifted toward node 814 at operation 908. At the same time, neighboring nodes are also shifted up the clock tree toward node 918. In a subsequent rebalancing operation 910, node 918 is shifted up the clock tree toward node 920. The final rebalancing operation 912 includes shifting node 920 toward node 814. These operations successfully re-balance the loads seen at the nodes of clock tree 804 after the group of clock sinks have been modified to depend from node 814. An example of clock tree diagram 902 provides a view of a balanced clock tree diagram after the group of clock sinks have been modified. As shown, the wirelength 904 of node is shortened to decrease the amount of delay it takes a clock signal to propagate from node 814 to clock sinks 808. Additionally, wirelength 906 have been increased through operation 908, 910, and 912 to offset additional load capacities caused by the relocation of the group of clock sinks 808. The drawn clock tree diagrams are for reference only and are not drawn to scale.

Figure 10:
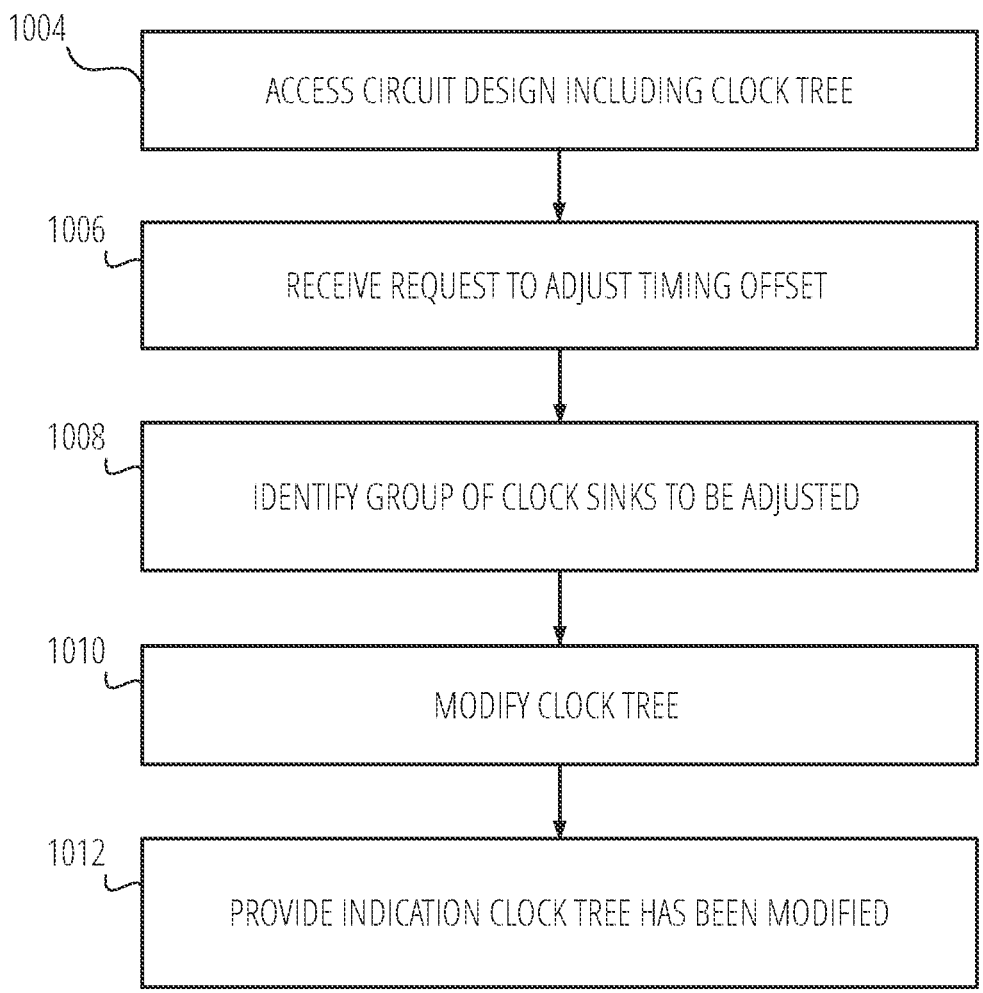
FIGS. 10-11 are flowcharts illustrating operations of example methods for clock tree restructuring after Clock Tree Synthesis (CTS) in accordance with some embodiments.

FIGS. 10-1.1 are flowcharts illustrating operations of example methods for clock tree restructuring after Clock Tree Synthesis (CTS) in accordance with some embodiments. For some embodiments, the method 1002 is performed as part of a post-CTS process applied to a circuit design (e.g., by an EDA software system).

It will be understood that the method 1002 may be performed by a device, such as a computing device executing instructions of an EDA software system. For instance, the operations of a method 1002 may be represented by executable instructions (e.g., EDA software) that, when executed by a processor of a computing device, cause the computing device to perform the method 1002. Thus, an operation of the method 1002 may be performed by a hardware processor (e.g., central processing unit or graphics processing unit) of a computing device (e.g., desktop, server, etc.). Accordingly, the method 800 is described below in reference to such a computing device.

Depending on the embodiment, an operation of the method 1002 may be repeated in different ways or involve intervening operations not shown. Though the operations of the method 1002 may be depicted and described in a certain order, the order in which the operations are performed may vary among embodiments, including performing certain operations in parallel.

The method 1002 as illustrated begins at operation 1004 to access a circuit design (e.g., integrated circuit design) including a clock tree, where the computing device accesses integrated circuit design stored in a memory of the computing device. The circuit design comprises a clock tree comprising one or more routes that interconnect a plurality of clock tree instances. Clock tree instances can include buffers, sinks, gates, inverters, and so on.

At operation 1006, the computing device receives a request specifying an adjusted timing offset for the clock tree. For example, after CTS, a user requests that a specific timing criteria be met. The user may not know how to achieve this without expending precious time and resources in re-generating a new clock tree. In such a scenario, the user may request, after CTS, that an adjusted timing offset be met. In some embodiments, the adjusted timing offset is to reduce a delay time of the clock tree. In some embodiments, the adjusted timing offset is to increase a delay time of the clock tree.

The computing device identifies a group of two or more clock tree instances to be adjusted from the clock tree to comply with the request at operation 1008. The computing device may determine a particular grouping of clock tree instances based on physical proximity, logical and electrical equivalence, and/or having a similar target insertion delay time. The target insertion delay time is calculated by subtracting the requested adjusted timing offset by the current timing. If two or more clock tree instances share a similar target insertion delay time, they may be subject to grouping.

At operation 1010, the computing device restructures the clock tree by moving a terminal of the group of two or more clock tree instances from a first location to a second location of the clock tree to generate an updated clock tree. In some embodiments, the computing device restructures the clock tree by moving a single clock tree instance from a first location to a second location of the clock tree to generate an updated clock tree. Furthermore, it is understood that a "group" of clock tree instances may not necessarily be within physical proximity. Rather, it is possible that a "group" of clock tree instances (e.g., one clock sink) within various locations of the clock tree can be targeted for restructuring at a time. As shown in examples of FIGS. 2-9, a terminal or node of the group of instances is selected to be moved from a first location to a second location (typically to a higher level or position) within the clock tree.

In some embodiments, the terminal of the group is a clock gate (as seen in FIGS. 2-4). In accordance with some embodiments, the terminal of the group is an input pin of a buffer or an inverter of the clock tree (as seen in FIGS. 5 and 6). In accordance with some embodiments, the terminal of the group is a pin of the group of two or more clock tree instances (as seen in FIG. 7).

In accordance with some embodiments, the computing device generates a cloned version of the terminal of the group of clock tree instances and a subset of the group is moved to a second location in the clock tree along with the cloned version of the terminal. The remaining elements of the group of the clock tree instances are maintained at the first location within the clock tree (as seen in FIG. 4).

The computing device provides an indication that the updated clock tree has been generated and complies with the adjusted timing offset at operation 1012.

Figure 11:
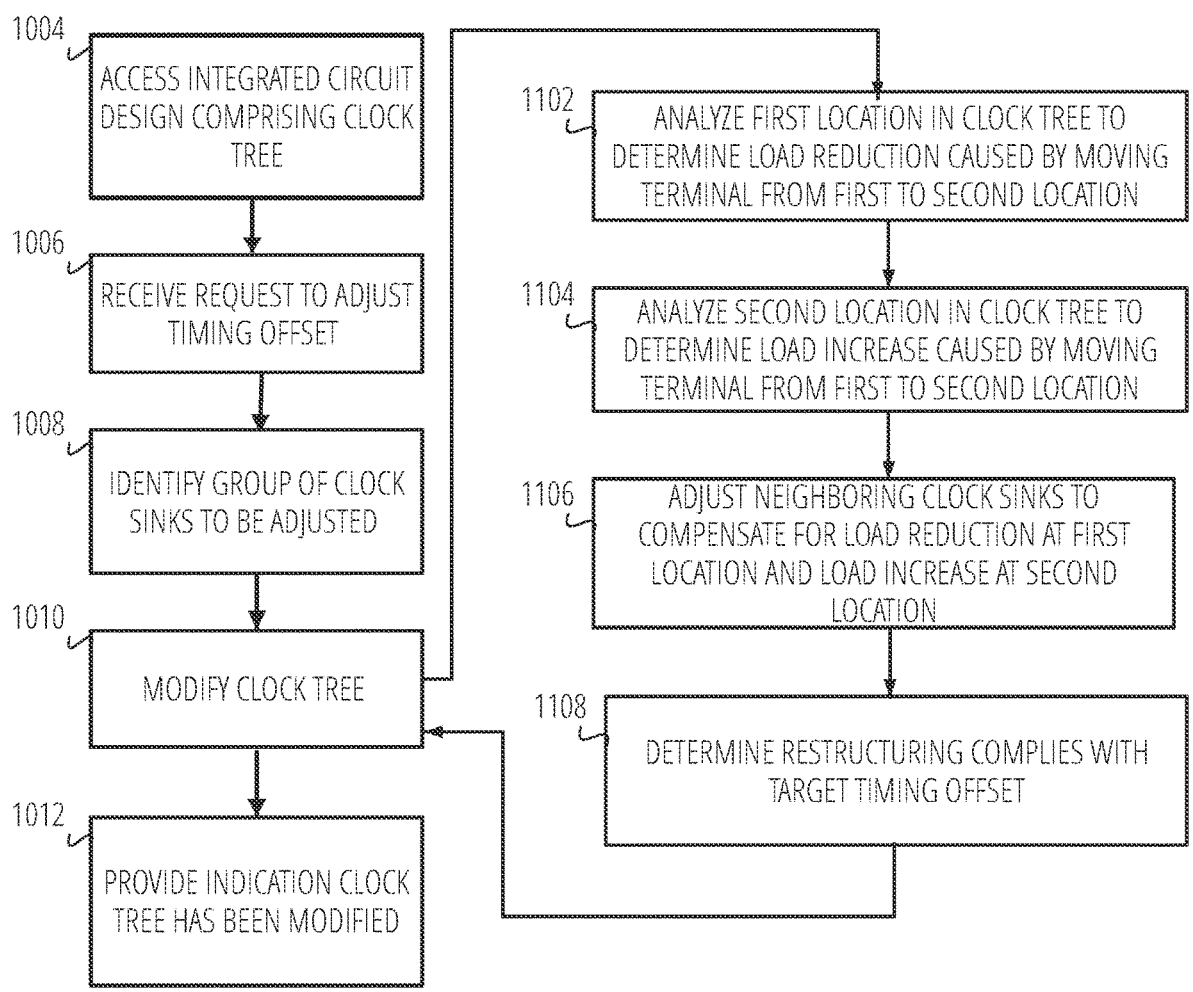

FIG. 11 illustrates additional operations of method 1002 in accordance with some embodiments. As shown in FIG. 11, method 1002 may, in some embodiments, include operations 1102, 1104, 1106, and 1108, Consistent with these embodiments, the operations 1102, 1104, 1106, and 1108 may be performed preceding operation 1012 where the computing device updates the clock tree.

At operation 1102, the computing device analyzes the first location in the clock tree to determine a load reduction caused by moving the terminal from a first to a second location. The computing device analyzes, at operation 1104, the second location in the clock tree to determine a load increase caused by moving the terminal from the first to the second location. To compensate for the load reduction at the first and the load increase at the second location, neighboring clock sinks (e.g., adjacent to or within five nodes) are adjusted accordingly at operation 1106. In some embodiments, neighboring instances having spare load capacity are identified. One or more of the neighboring instances having spare load capacity are selected from a higher region of the clock tree and relocated to a location in a bottom region of the clock tree. This allows the clock tree to balance neighboring instances having spare capacities with the relocated group of clock sinks that have caused an increase in load capacity at the destination location (e.g., second location), In some embodiments, moving the group of clock sinks from the first location to the second location causes an increase in wirelength of an instance at the first location and/or the second location.

In some embodiments, the one or more neighboring instances are adjusted by moving the neighboring instances in an upward direction from a lower region of the clock tree to a higher region of the clock tree.

At operation 1108, the computing device determines the restructuring complies with the target timing offset. The computing device also validates that the updated clock tree does not violate any timing constraints and if the updated clock tree does violate timing constraints, the computing device may repeat the performance of operation 1106. In some embodiments one or more alternative solutions for moving the terminal of the group of clock sinks are identified. Based on the identification, a solution having a lowest number of adjustments to be made to the one or more neighboring instances is selected and implemented. In some embodiments, adjusting neighboring clock sinks cannot compensate for the load increase and reduction by the restructuring. In such scenarios, a new group of clock sinks may be identified to be adjusted and the operations 1102-1108 may be repeated for the new group of clock sinks. In some embodiments, there are no solutions to adjusting the clock tree to the adjusted timing offset and an indication is provided that there are no solutions available to adjust the timing offset to the requested time, Additionally, the adjustments may include resizing a clock node (e.g., buffer, inverter, clock gate) by selecting a different physical implementation of the clock node logic. The resized clock node may have smaller or larger transistors that affect the ability to drive the signal at the node. The clock nodes may alternatively be relocated to various locations within the clock tree.

The computing device may also adjust neighboring clock instances (e.g., clock sinks) to compensate for a lower load on the source (e.g., first location). This may include inserting or removing buffers from the neighboring clock instances to compensate for the decreased load.

At operation 1108, the computing device determines that the restructuring of the clock tree complies with the requested timing offset. In some embodiments, the clock tree can be adjusted to a specific range within of the requested adjusted timing offset (e.g., +/−10%), After the determination has been made that the restructuring complies with the requested timing adjustment, the computing device keeps the updated clock tree and provides an indication that an updated clock tree has been generated that complies with the request. However, if the computing device determines that restructuring of the clock tree cannot be performed at least within a portion of the dock tree, the computing device may search for alternate locations within the clock tree to perform the restructuring. In some embodiments, the computing device may provide an indication that the clock tree cannot be restructured according to the requested timing adjustment and revert to the original clock tree.

The method 1002 may be iteratively repeated as needed within various locations of the dock tree to perform the requested timing adjustment.

Figure 12:
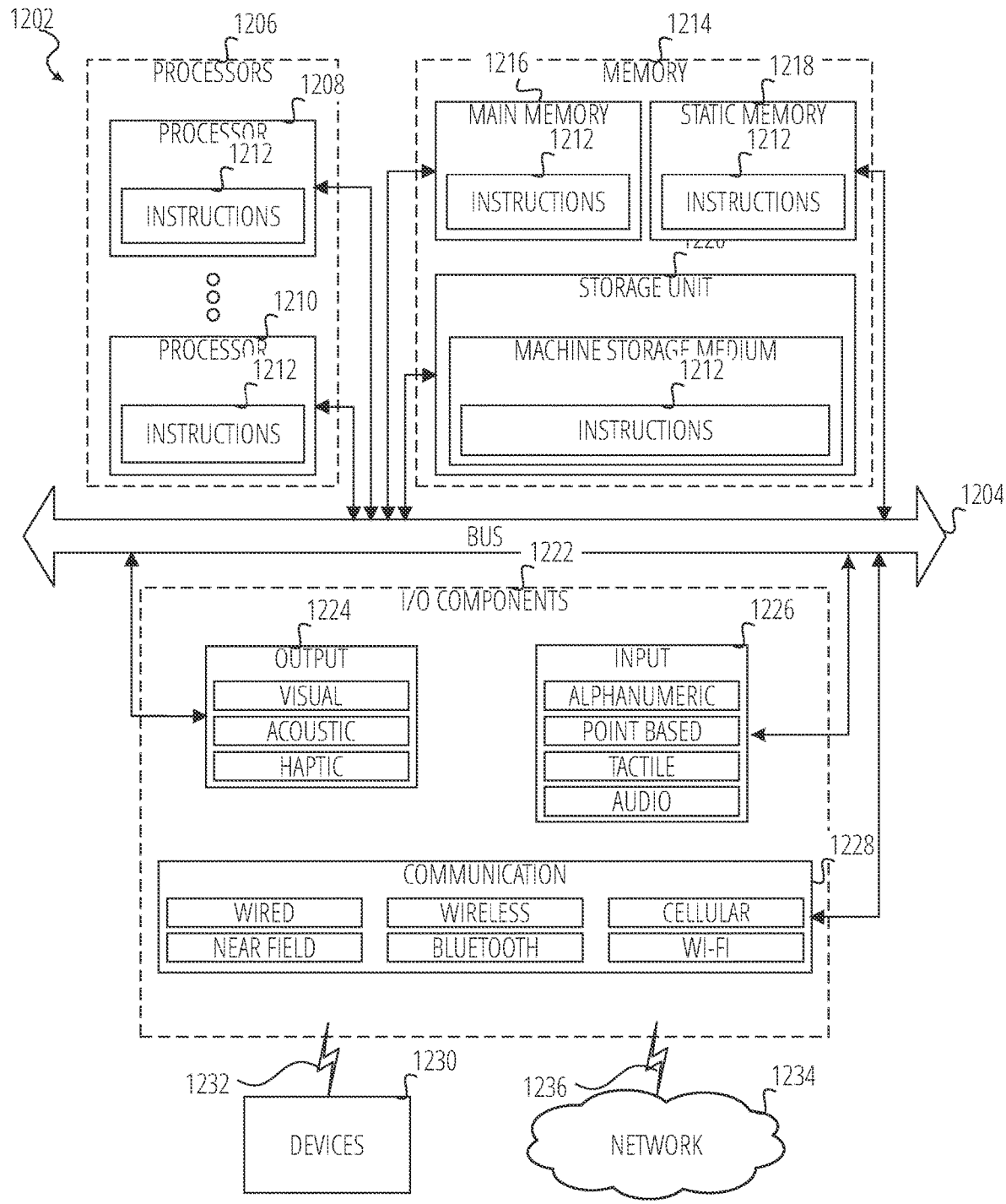
FIG. 12 illustrates an example system for performing post-CTS restructuring in accordance with some embodiments.

FIG. 12 illustrates a diagrammatic representation of a machine 1202 in the form of a computer system within which a set of instructions may be executed for causing the machine 1202 to perform any one or more of the methodologies discussed herein, according to an example embodiment. Specifically, FIG. 12 shows a diagrammatic representation of the machine 1202 in the example form of a computer system, within which instructions 1212 (e.g., software, a program, an application, an applet, an app, or other executable code) for causing the machine 1202 to perform any one or more of the methodologies discussed herein may be executed. For example, the instructions 1212 may cause the machine 1202 to execute an EDA software system that executes the method 1002. Additionally, or alternatively, the instructions 1212 may implement FIGS. 1, 2-9, and 10-11. The instructions 1212 transform the general, non-programmed machine 1202 into a particular machine 1202 programmed to carry out the described and illustrated functions in the manner described here. In alternative embodiments, the machine 1202 operates as a standalone device or may be coupled (e.g., networked) to other machines. In a networked deployment, the machine 1202 may operate in the capacity of a server machine or a client machine in a server-client network environment, or as a peer machine in a peer-to-peer (or distributed) network environment. The machine 1202 may comprise, but not be limited to, a server computer, a client computer, a personal computer (PC), a tablet computer, a laptop computer, a netbook, a smart phone, a mobile device, a), a network router, a network switch, a network bridge, or any machine capable of executing the instructions 1212, sequentially or otherwise, that specify actions to be taken by the machine 1202. Further, while only a single machine 1202 is illustrated, the term "machine" shall also be taken to include a collection of machines 1202 that individually or jointly execute the instructions 1212 to perform any one or more of the methodologies discussed herein.

The machine 1202 may include processor(s) 1206, memory 1214, and I/O components 1222, which may be configured to communicate with each other such as via a bus 1204. In an example embodiment, the processor 1206 (e.g., a central processing unit (CPU), a reduced instruction set computing (RISC) processor, a complex instruction set computing (CISC) processor, a graphics processing unit (GPU), a digital signal processor (DSP), an application-specific integrated circuit (ASIC), a radio-frequency integrated circuit (RFIC), another processor, or any suitable combination thereof) may include, for example, a processor 1208 and a processor 1206 that may execute the instructions 1212. The term "processor" is intended to include multi-core processor 1208 that may comprise two or more independent processors (sometimes referred to as "cores") that may execute instructions contemporaneously. Although FIG. 12 shows multiple processor s 1206, the machine 1202 may include a single processor with a single core, a single processor with multiple cores (e.g., a multi-core processor), multiple processors with a single core, multiple processors with multiple cores, or any combination thereof.

The memory 1214 may include a main memory 1216, a static memory 1218, and a storage unit 1220, each accessible to the processor 1208 such as via the bus 1204. The main memory 1216, the static memory 1218, and the storage unit 1220 store the instructions 1212 embodying any one or more of the methodologies or functions described herein. The instructions 1212 may also reside, completely or partially, within the main memory 1216, within the static memory 1218, within the storage unit 1220, within at least one of the processors 1206 (e.g., within the processor's cache memory), or any suitable combination thereof, during execution thereof by the machine 1202.

The I/O components 1222 may include a wide variety of components to receive input, provide output, produce output, transmit information, exchange information, capture measurements, and so on. The specific I/O components 1222 that are included in a particular machine will depend on the type of machine. For example, portable machines such as mobile phones will likely include a touch input device or other such input mechanisms, while a headless server machine will likely not include such a touch input device. It will be appreciated that the I/O components 1222 may include many other components that are not shown in FIG. 12. The I/O components 1222 are grouped according to functionality merely for simplifying the following discussion and the grouping is in no way limiting. In various example embodiments, the I/O components 1222 may include output components 1224 and input components 1226. The output components 1224 may include visual components (e.g., a display such as a plasma display panel (PDP), a light emitting diode (LED) display, a liquid crystal display (LCD), a projector, or a cathode ray tube (CRT)), acoustic components (e.g., speakers), other signal generators, and so forth. The input components 1226 may include alphanumeric input components (e.g., a keyboard, a touch screen configured to receive alphanumeric input, a photo-optical keyboard, or other alphanumeric input components), point-based input components (e.g., a mouse, a touchpad, a trackball, a joystick, a motion sensor, or another pointing instrument), tactile input components (e.g., a physical button, a touch screen that provides location and/or force of touches or touch gestures, or other tactile input components), audio input components (e.g., a microphone), and the like.

Communication may be implemented using a wide variety of technologies. The I/O components 1222 may include communication components 1228 operable to couple the machine 1202 to a network 1234 or devices 1230 via a coupling 1236 and a coupling 1232, respectively. For example, the communication components 1228 may include a network interface component or another suitable device to interface with the network 1234. In further examples, the communication components 1228 may include wired communication components, wireless communication components, cellular communication components, and other communication components to provide communication via other modalities. The devices 1230 may be another machine or any of a wide variety of peripheral devices (e.g., a peripheral device coupled via a universal serial bus (USB)).

Executable Instructions and Machine Storage Medium

The various memories (e.g., 1214, 1216, 1218), and/or memory of the processor(s) 1206 and/or the storage unit 1220 may store one or more sets of instructions and data structures (e.g., software) embodying or utilized by any one or more of the methodologies or functions described herein. These instructions, when executed by the processor(s) 1208, cause various operations to implement the disclosed embodiments.

As used herein, the terms "machine-storage medium," "device-storage medium," and "computer-storage medium" mean the same thing and may be used interchangeably in this disclosure. The terms refer to a single or multiple storage devices and/or media (e.g., a centralized or distributed database, and/or associated caches and servers) that store executable instructions and/or data. The terms shall accordingly be taken to include, but not be limited to, solid-state memories, and optical and magnetic media, including memory internal or external to processors. Specific examples of machine-storage media, computer-storage media, and/or device-storage media include non-volatile memory, including by way of example semiconductor memory devices, e.g., erasable programmable read-only memory (EPROM), electrically erasable programmable read-only memory (EEPROM), field-programmable gate arrays (FPGAs), and flash memory devices; magnetic disks such as internal hard disks and removable disks; magneto-optical disks; and CD-ROM and DVD-ROM disks. The terms "machine-storage media," "computer-storage media," and "device-storage media" specifically exclude carrier waves, modulated data signals, and other such media, at least some of which are covered under the term "signal medium" discussed below.

Transmission Medium

In various example embodiments, one or more portions of the network 1234 may be an ad hoc network, an intranet, an extranet, a virtual private network (VPN), a local-area network (LAN), a wireless LAN (WLAN), a wide-area network (WAN), a wireless WAN (WWAN), a metropolitan-area network (MAN), the Internet, a portion of the Internet, a portion of the public switched telephone network (PSTN), a plain old telephone service (POTS) network, a cellular telephone network, a wireless network, a Wi-Fi® network, another type of network, or a combination of two or more such networks. For example, the network 1234 or a portion of the network 1234 may include a wireless or cellular network, and the coupling 1236 may be a Code Division Multiple Access (CDMA) connection, a Global System for Mobile communications (GSM) connection, or another type of cellular or wireless coupling. In this example, the coupling 1236 may implement any of a variety of types of data transfer technology, such as Single Carrier Radio Transmission Technology (1xRTT), Evolution-Data Optimized (EVDO) technology, General Packet Radio Service (CPRS) technology, Enhanced Data rates for GSM Evolution (EDGE) technology, third Generation Partnership Project (3GPP) including 3G, fourth generation wireless (4G) networks, Universal Mobile Telecommunications System (UMTS), High-Speed Packet Access (HSPA), Worldwide Interoperability for Microwave Access (WiMAX), Long Term Evolution (LTE) standard, others defined by various standard-setting organizations, other long-range protocols, or other data transfer technology.

The instructions 1212 may be transmitted or received over the network 1234 using a transmission medium via a network interface device (e.g., a network interface component included in the communication components 1228) and utilizing any one of a number of well-known transfer protocols (e.g., hypertext transfer protocol (HTTP)). Similarly, the instructions 1212 may be transmitted or received using a transmission medium via the coupling 1232 (e.g., a peer-to-peer coupling) to the devices 1230. The terms "transmission medium" and "signal medium" mean the same thing and may be used interchangeably in this disclosure. The terms "transmission medium" and "signal medium" shall be taken to include any intangible medium that is capable of storing, encoding, or carrying the instructions 1212 (deleted) for execution by the machine 1202, and include digital or analog communications signals or other intangible media to facilitate communication of such software. Hence, the terms "transmission medium" and "signal medium" shall be taken to include any form of modulated data signal, carrier wave, and so forth. The term "modulated data signal" means a signal that has one or more of its characteristics set or changed in such a manner as to encode information in the signal.

Computer-Readable Medium

The terms "machine-readable medium," "computer-readable medium," and "device-readable medium" mean the same thing and may be used interchangeably in this disclosure. The terms are defined to include both machine-storage media and transmission media. Thus, the terms include both storage devices/media and carrier waves/modulated data signals.

The various operations of example methods described herein may be performed, at least partially, by one or more processors that are temporarily configured (e.g., by software) or permanently configured to perform the relevant operations. Similarly, the methods described herein may be at least partially processor-implemented. For example, at least some of the operations of a method may be performed by one or more processors. The performance of certain of the operations may be distributed among the one or more processors, not only residing within a single machine, but deployed across a number of machines. In some example embodiments, the processor or processors may be located in a single location (e.g., within a home environment, an office environment, or a server farm), while in other embodiments the processors may be distributed across a number of locations.

Although the embodiments of the present disclosure have been described with reference to specific example embodiments, it will be evident that various modifications and changes may be made to these embodiments without departing from the broader scope of the inventive subject matter. Accordingly, the specification and drawings are to be regarded in an illustrative rather than a restrictive sense. The accompanying drawings that form a part hereof show, by way of illustration, and not of limitation, specific embodiments in which the subject matter may be practiced. The embodiments illustrated are described in sufficient detail to enable those skilled in the art to practice the teachings disclosed herein. Other embodiments may be used and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent, to those of skill in the art, upon reviewing the above description.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended; that is, a system, device; article, or process that includes elements in addition to those listed after such a term in a claim is still deemed to fall within the scope of that claim.

What is claimed is:

1. A system comprising:
   one or more processors; and
   a memory storing instructions that, when executed by the one or more processors, cause the system to perform operations comprising:
      accessing an integrated circuit design stored in memory, the integrated circuit design comprising a clock tree that includes routes that interconnect a clock source to a plurality of clock sinks;
      receiving a request to adjust a present, timing offset of the clock tree to a target timing offset;
      modifying the clock tree by moving a terminal of a group of clock sinks from a first location in the clock tree to a second location in the clock tree, the modifying comprising:
         analyzing the first location in the clock tree to determine a load reduction caused by moving the terminal from the first location to the second location;
         analyzing the second location in the clock tree to determine a load increase caused by moving the terminal from the first location to the second location; and
         adjusting one or more neighboring instances of the group of clock sinks within the clock tree to compensate for the load reduction at the first location and the load increase at the second location; and
      providing an indication that the clock tree has been modified and complies with the target timing offset.

2. The system of claim 1, wherein modifying the clock tree further comprises:
   identifying neighboring instances having spare load capacity;
   selecting one or more of the neighboring instances from a higher region of the clock tree and relocating the one or more neighboring instances to a location in a lower region of the clock tree; and
   verifying that design rules of the clock tree have not been violated.

3. The system of claim 1, wherein moving the group of clock sinks from the first location to the second location increases a wirelength of an instance at the first location.

4. The system of claim 1, wherein moving the group of clock sinks from the first location to the second location decreases a wirelength of an instance at the second location.

5. The system of claim 1, wherein modifying the clock tree further comprises adjusting the one or more neighboring instances in an upward direction from a lower region of the clock tree to a higher region of the clock tree.

6. The system of claim 1, wherein modifying the clock tree further comprises identifying one or more alternative solutions for moving the terminal of the group of clock sinks and selecting a solution of the one or more alternative solutions having a lowest number of adjustments to be made to the one or more neighboring instances.

7. The system of claim 1, wherein providing the indication comprises:
   verifying that modified clock tree complies with design rules for the clock tree.

8. The system of claim 1, wherein the target timing offset is a reduction in delay from the present timing offset for a specified group of clock sinks and the group of clock sinks is the specified group of clock sinks.

9. A method, comprising:
   accessing an integrated circuit design stored in memory, the integrated circuit design comprising a clock tree that includes routes that interconnect a clock source to a plurality of clock sinks;
   receiving a request to adjust a present timing offset of the clock tree to a target timing offset;
   modifying the clock tree by moving a terminal of a group of clock sinks from a first location in the clock tree to a second location in the clock tree, the modifying comprising:
      adjusting one or more neighboring instances of the group of clock sinks within the clock tree to compensate for a load reduction at the first location and a load increase at the second location; and
   providing an indication that the clock tree has been modified and complies with the target timing offset.

10. The method of claim 9, wherein modifying the clock tree further comprises:
    analyzing the first location in the clock tree to determine the load reduction caused by moving the terminal from the first location to the second location; and
    analyzing the second location in the clock tree to determine the load increase caused by moving the terminal from the first location to the second location.

11. The method of claim 9, wherein modifying the clock tree further comprises:
    identifying neighboring terminals having spare load capacity;
    selecting one or more of the neighboring instances from a bottom region of the clock tree and relocating the one or more neighboring instances to a location in a higher region of the clock tree; and
    verifying that design rules of the clock tree have not been violated.

12. The method of claim 9, wherein moving the group of clock sinks from the first location to the second location increases a wirelength of an instance at the first location.

13. The method of claim 9, wherein moving the group of clock sinks from the first location to the second location decreases a wirelength of an instance at the second location.

14. The method of claim 9; wherein modifying the clock tree further comprises adjusting the one or more neighboring instances in an upward direction from a lower region of the clock tree to a higher region of the clock tree.

15. The method of claim 9, wherein modifying the clock tree further comprises identifying one or more alternative solutions for moving the terminal of the group of clock sinks and selecting a solution of the one or more alternative solutions having a lowest number of adjustments to be made to the one or more neighboring instances.

16. The method of claim 9, wherein modifying the clock tree further comprises:

verifying that modified clock tree complies with design rules for the clock tree.

17. The method of claim 9, wherein the target timing offset is a reduction in delay from the present timing offset for a specified group of clock sinks and the group of clock sinks is the specified group of clock sinks.

18. A non-transitory computer-readable storage medium storing instructions that, when executed by one or more processors, cause the one or more processors to perform operations comprising:

accessing an integrated circuit design stored in memory, the integrated circuit design comprising a clock tree that includes routes that interconnect a clock source to a plurality of clock sinks;

receiving a request to adjust a present timing offset of the clock tree to a target timing offset;

identifying, from the clock tree, a group of clock sinks to be adjusted to satisfy the request;

modifying the clock tree by moving a terminal of a group of clock sinks from a first location in the clock tree to a second location in the clock tree, the modifying comprising:

concurrently adjusting one or more neighboring instances of the group of clock sinks of the clock tree to compensate for a load reduction of the first location and a load increase of the second location; and providing an indication that the clock tree has been modified and complies with the target timing offset.

19. The nontransitory computer-readable storage medium of claim 18, wherein the target timing offset is a reduction in delay from the present timing offset for a specified group of clock sinks and the group of clock sinks is the specified group of clock sinks.

20. The non-transitory computer-readable storage medium of claim 18, wherein modifying the clock tree further comprises adjusting the one or more neighboring instances in an upward direction from a lower region of the clock tree to a higher region of the clock tree.

* * * * *